United States Patent
Wang et al.

(10) Patent No.: US 7,661,186 B2
(45) Date of Patent: Feb. 16, 2010

(54) FABRICATION METHOD OF RADIO FREQUENCY IDENTIFICATION ANTENNA COIL

(75) Inventors: Chung-Wei Wang, Hsinchu (TW); Yung-Kuo Ho, Hsinchu (TW); Ming-Huan Yang, Hsinchu (TW); Chia-Chi Wu, Hsinchu (TW); Chao-Kai Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 437 days.

(21) Appl. No.: 11/590,856

(22) Filed: Nov. 1, 2006

(65) Prior Publication Data
US 2007/0124914 A1 Jun. 7, 2007

(30) Foreign Application Priority Data
Dec. 7, 2005 (TW) .............................. 94143233 A

(51) Int. Cl.
*H01Q 17/00* (2006.01)
(52) U.S. Cl. .............................. 29/601; 29/605; 29/606; 29/609.1; 205/199; 205/122; 340/572.7; 343/728; 343/741; 343/764; 343/748; 343/750

(58) Field of Classification Search .................. 29/600, 29/601, 605, 606; 205/119, 122; 340/572.7; 343/728, 741, 764, 748, 750, 866
See application file for complete search history.

(56) References Cited

U.S. PATENT DOCUMENTS

| 4,694,365 A | * | 9/1987 | Kinjo ....................... 360/100.1 |
| 4,729,048 A | * | 3/1988 | Imakoshi et al. ......... 360/234.7 |
| 5,494,722 A | * | 2/1996 | Oka et al. ................. 428/832.2 |

FOREIGN PATENT DOCUMENTS

| JP | 2000-261230 | 9/2000 |
| JP | 2002-368525 | 12/2002 |
| TW | 510149 | 11/2002 |

* cited by examiner

*Primary Examiner*—Paul D Kim
(74) *Attorney, Agent, or Firm*—Rabin & Berdo, P.C.

(57) ABSTRACT

A fabrication method of a radio frequency identification (RFID) antenna coil is provided. First, a substrate is processed by a surface modified procedure, to form a self-assembly membranes (SAMs) on a surface of the substrate. A catalyst is sprayed on the SAMs of the substrate according to patterning. After that, the first electroless plating procedure is first carried out for the substrate to generate a magnetic metal layer corresponding to the wiring pattern on the catalyst, and the second electroless plating procedure is then carried out for the substrate to generate the metal layer on the magnetic metal layer.

10 Claims, 9 Drawing Sheets

1

FABRICATION METHOD OF RADIO FREQUENCY IDENTIFICATION ANTENNA COIL

CROSS-REFERENCE TO RELATED APPLICATIONS

This non-provisional application claims priority under 35 U.S.C. § 119(a) on Patent Application No(s). 094143233 filed in Taiwan, R.O.C. on Dec. 7, 2005, the entire contents of which are hereby incorporated by reference.

BACKGROUND OF THE INVENTION

1. Field of Invention

The present invention relates to an antenna coil structure and fabricated method therefor and more particularly, to a radio frequency identification (RFID) antenna coil with flexible substrate, higher inductance and a fabricated method therefor.

2. Related Art

Nowadays, non-contact radio frequency systems have been generally applied in many industries. In the future, after each product leaves the factory, a non-contact radio frequency system will be attached on the product. This system will record relative data about upstream and downstream manufacturers of the product (such as product specification, material, and shipping data), data required by logistics (such as logistics network and stock information), information required by consumers (such as price, qualified mark, instruction manual, and service station). And different clients have different access rights to the information.

The structure of the radio frequency identification (RFID) antenna coil system may be divided into two parts: the first part is a card module, comprising: a power supply and an antenna coil for transmitting and receiving data, a transceiver module, and an identification data; the second part is a reader device, comprising: a transceiver antenna coil, a transceiver module, and a control circuit. The reader device transmits an electromagnetic wave, and when the card module approaches the reader device, the antenna coil in the card module will receive the electromagnetic wave, and store the energy as an electric power for the card module, and transmit the identification date in the card module to the reader device as a radio wave, for confirmation and further control.

To enhance the inductive coupling efficiency, usually the number of turns of coil windings is increased to enhance inductance. However, many problems may be caused with the fabricated method, such as, enlarged element volume, increased resistance value, multi-circle signal noise, reduced induction distance, and weaker recognition rate.

Referring to Japanese Patent No. JP2002368525, wherein the antenna coil is processed with a multi-layer lamination and a magnetic powder substrate (e.g. Mg, Fe, Co etc.) perpendicular to the antenna coil is disposed at a central part of the antenna coil, thereby increasing the inductance, such a method can increase the inductance, however, the element thickness is increased, and also the antenna is inflexible, and therefore, the method has no essential advantage and competitiveness in market application.

Referring to Japanese Patent No. JP2000261230, the fabrication of an antenna coil is similar to the above one in that multi-layers of antenna are laminated, and the difference there-between is in that here the magnetic substance is arranged in a same direction with the metal wiring. The element thickness can be reduced; however, the inductance can thus only be raised in a limited range.

Therefore, it becomes one of the problems to be solved by the researchers how to provide a RFID antenna coil and fabricated method therefor, for enabling the antenna coil to be flexibility and have higher inductance.

SUMMARY OF THE INVENTION

In view of above problems, an object of the present invention is to provide a radio frequency identification (RFID) antenna coil and fabricated method therefor, for raising the inductance of the antenna through the resonance between the magnetic metal layer and the metal wiring.

Therefore, to achieve the above object, the fabricated method of the RFID antenna coil disclosed in the present invention comprises: processing a substrate by a surface modified procedure (e.g. plasma treatment, ion treatment, or ozone treatment), to form a self-assembly membranes (SAMs) on a surface of the substrate; spray catalyst on the SAMs of the substrate according to patterning; carrying out the first electroless plating procedure for the substrate, to generate a magnetic metal layer corresponding to the wiring pattern on the catalyst; and carrying out the second electroless plating procedure for the substrate, to generate the metal layer on the magnetic metal layer.

Furthermore, to achieve above object, the fabricated method of a RFID antenna coil disclosed in the present invention comprises: processing a substrate through a surface modified procedure, to form the SAMs on the top and bottom surfaces of the substrate; forming a cover layer on the SAMs; fabricating at least one through hole in the substrate; further forming the SAMs on the cover layer; spray catalyst on the SAMs of the cover layer according to patterning; carrying out the first electroless plating procedure for the substrate, to generate a magnetic metal layer corresponding to the patterning on the catalyst; and carrying out the second electroless plating procedure for the substrate, to generate a metal layer on the magnetic metal layer.

Furthermore, to achieve the above object, the fabricated method of the RFID antenna coil disclosed in the present invention comprises: processing a substrate by surface modified procedure, to form the SAMs on the top and bottom surfaces of the substrate; spray catalyst on the SAMs of the top and bottom surfaces of the substrate according to the first patterning; electroless plating the substrate, to generate a magnetic metal corresponding to the first patterning on the top and bottom surfaces of the substrate; forming an insulation layer on the magnetic metal wiring; fabricating at least one through hole in the substrate; further forming the SAMs on the insulation layer; spray the catalyst on the insulation layer of the top surface of the substrate according to the second patterning; carrying out a first chemical plating procedure for the substrate, to generate a metal wiring corresponding to the second patterning on the catalyst of the top surface of the substrate; spray the catalyst on the insulation layer of the bottom surface of the substrate according to a third patterning; and carrying out a second chemical plating procedure for the substrate, to generate a metal layer corresponding to the third patterning on the catalyst of the bottom surface of the substrate.

Furthermore, to achieve the above object, a RFID antenna coil structure disclosed in the present invention comprises: a substrate; a SAMs, formed on a surface of the substrate; a magnetic metal layer, formed on the SAMs; and a metal layer, formed on the magnetic metal layer.

With the RFID antenna coil structure and fabricated method therefor, the antenna coil is made flexible by a flexible substrate, and the thickness of the antenna coil can be reduced and its inductance can be raised by generating a magnetic metal layer and a metal by electroless plating.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
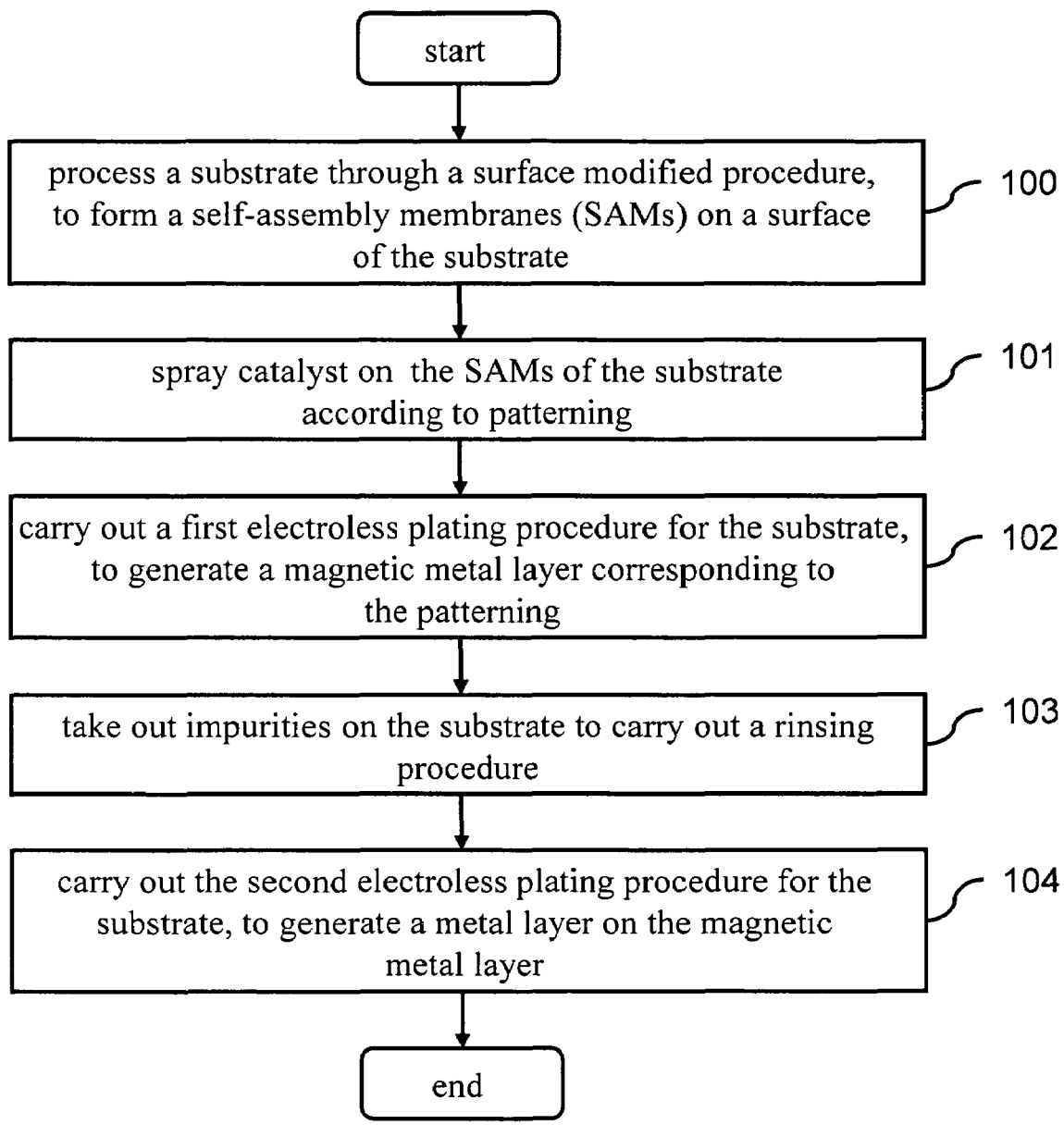
FIG. 1 is a flow chart of fabricating a single-layer radio frequency identification (RFID) antenna coil according to a first embodiment of the present invention.

Referring to FIG. 1, it is a flow chart of fabricating a single-layer radio frequency identification (RFID) antenna coil according to a first embodiment of the present invention, which comprises the following steps. Process a substrate through a surface modified procedure (e.g. plasma treatment, ion treatment, or ozone treatment), to form a self-assembly membranes (SAMs) on a surface of the substrate (e.g. a top surface or a bottom surface) (Step 100). Spray catalyst (such as $Na_2PdCl_4$ solutions and Pd $(NH_3)_4Cl_2$ solutions) on the SAMs of the substrate according to patterning by a PZT inkjet printer (Step 101), wherein the PZT inkjet printer sprays the catalyst on the substrate.

Carry out the first electroless plating procedure for the substrate, to generate a magnetic metal (such as Ni, Fe, or Co) layer corresponding to the patterning on the catalyst (Step 102). In the first electroless plating procedure, the substrate is immersed in an electroless plating tank filled with electroless plating bath (such as Ni plating solution), and then a magnetic metal layer is generated based on a redox potential principle, wherein the thickness of the magnetic metal layer can be changed by adjusting the electroless plating bath temperature and the electroless plating time. Then, take out the impurities on the substrate for carrying out a rinsing procedure (Step 103).

Carry out a second electroless plating procedure for the substrate, to generate a metal (such as Al, Ag, Cu, Ni, Fe, Co, Cd, or Pt) layer on the magnetic metal layer (Step 104). In the second electroless plating procedure, the substrate is immersed in an electroless plating tank filled with electroless plating bath (e.g. Cu plating solution), and then a metal layer is generated based on the redox potential principle, wherein the thickness of the metal layer can be changed by adjusting the electroless plating bath temperature and electroless plating time.

Figure 2:
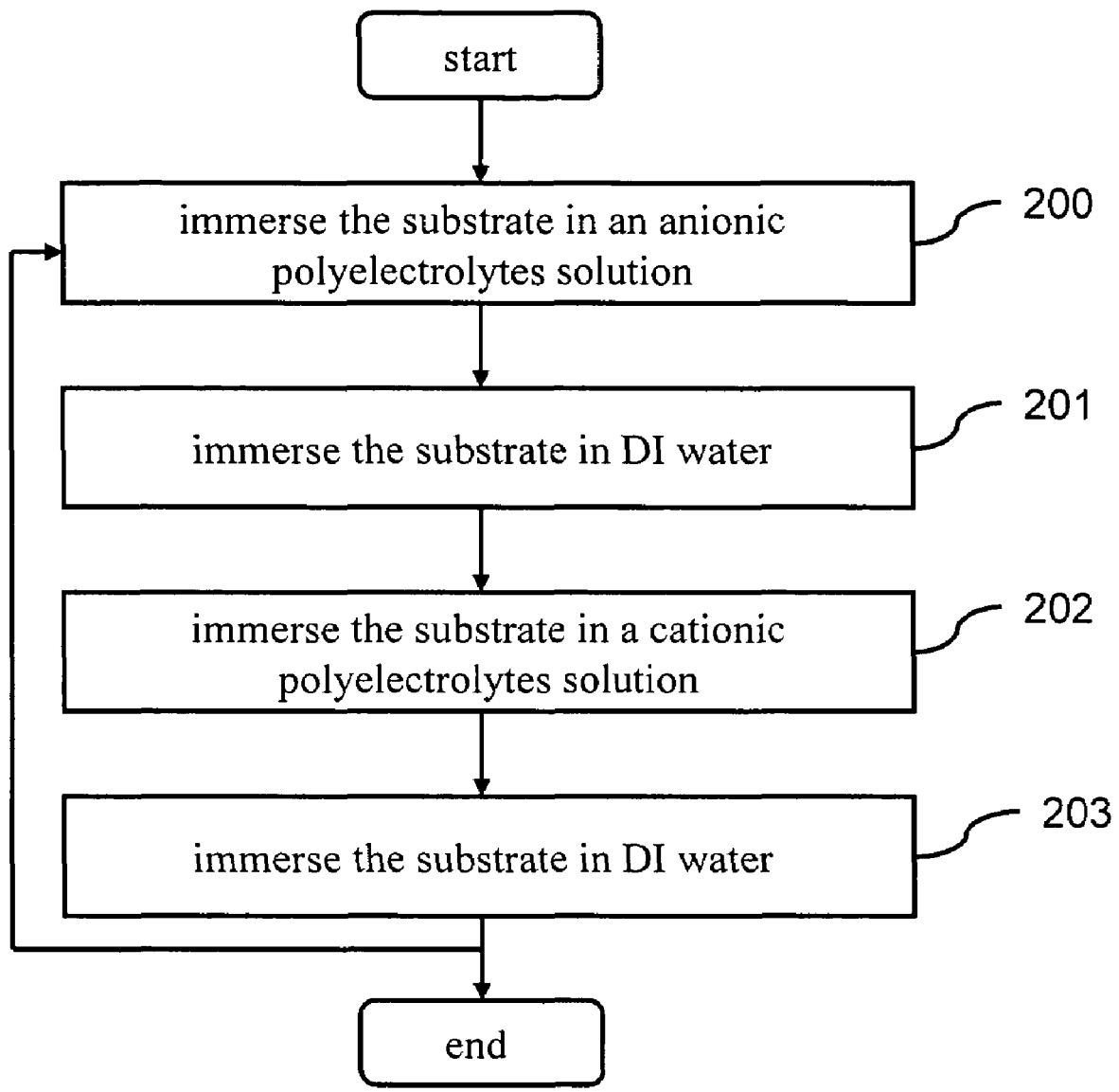
FIG. 2 is a flow chart of fabricating a self-assembly membranes (SAMs) according to the present invention.

Referring to FIG. 2, it is a flow chart of fabricating SAMs according to the present invention, which comprises the following steps. At first, immerse a substrate in an anionic polyelectrolytes solution (e.g. PAH solution) for several minutes (Step 200). Then, take out and soak the substrate in DI water (Step 201). Then, soak the substrate in the cationic polyelectrolytes solution (e.g. PAA solution) for several minutes (Step 202). Take out the substrate and immerse it in DI water (Step 203). And then, back to Step 200, repeat the above steps until the layers of required number are formed.

Figure 3:
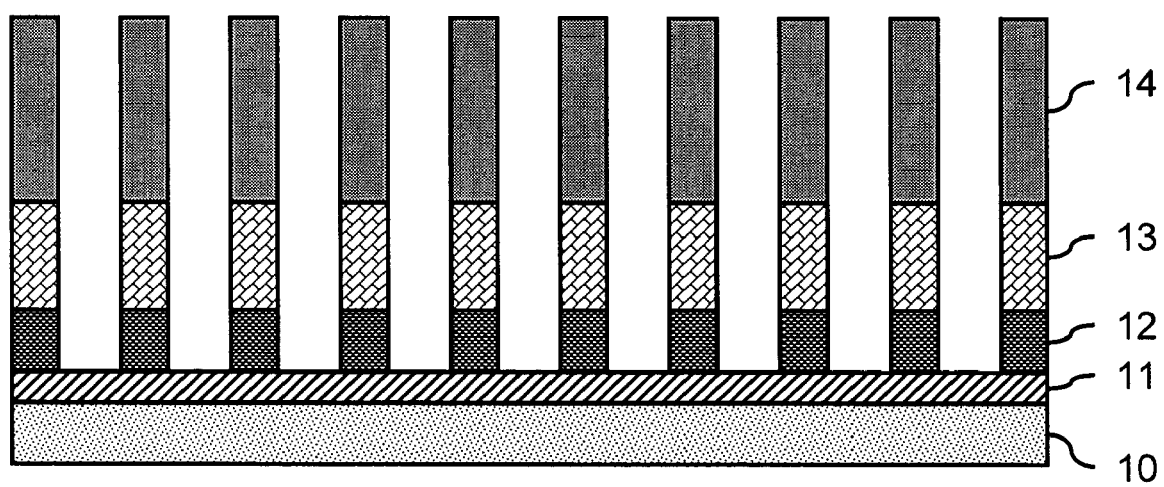
FIG. 3 is a schematic view of the single-layer RFID antenna coil according to the first embodiment of the present invention.

Referring to FIG. 3, it is a schematic view of the single-layer antenna coil according to the first embodiment of the present invention, which comprises a substrate 10, SAMs 11, a catalyst 12, a magnetic metal layer 13, and a metal layer 14.

In practice, the substrate 10 may comprise a glass substrate, a PET substrate, a flame retardant fiber glass epoxy (FR-4) substrate, and a flexible substrate (e.g. Polyimide substrate).

The SAMs 11 is formed on a surface of the substrate 10, and is in a structure of multi-layer membrane, for increasing the metal adhesiveness during the electroless plating processing of the substrate 10 and the lubricity and anti-corrosiveness of the substrate itself. In practice, the SAMs 11 may adopt a PAH/PAA multi-layer membranes.

The catalyst 12 is formed on the SAMs 11, and in practice may comprise $Na_2PdCl_4$ solutions and Pd $(NH_3)_4Cl_2$ solutions.

The magnetic metal layer 13 is formed on the catalyst 12 and in practice may comprise Ni, Fe, and Co material.

The metal layer 14 is formed on the magnetic metal layer 13, and in practice may comprise Al, Ag, Cu, Ni, Fe, Co, Cd, and Pt material.

Figure 4:
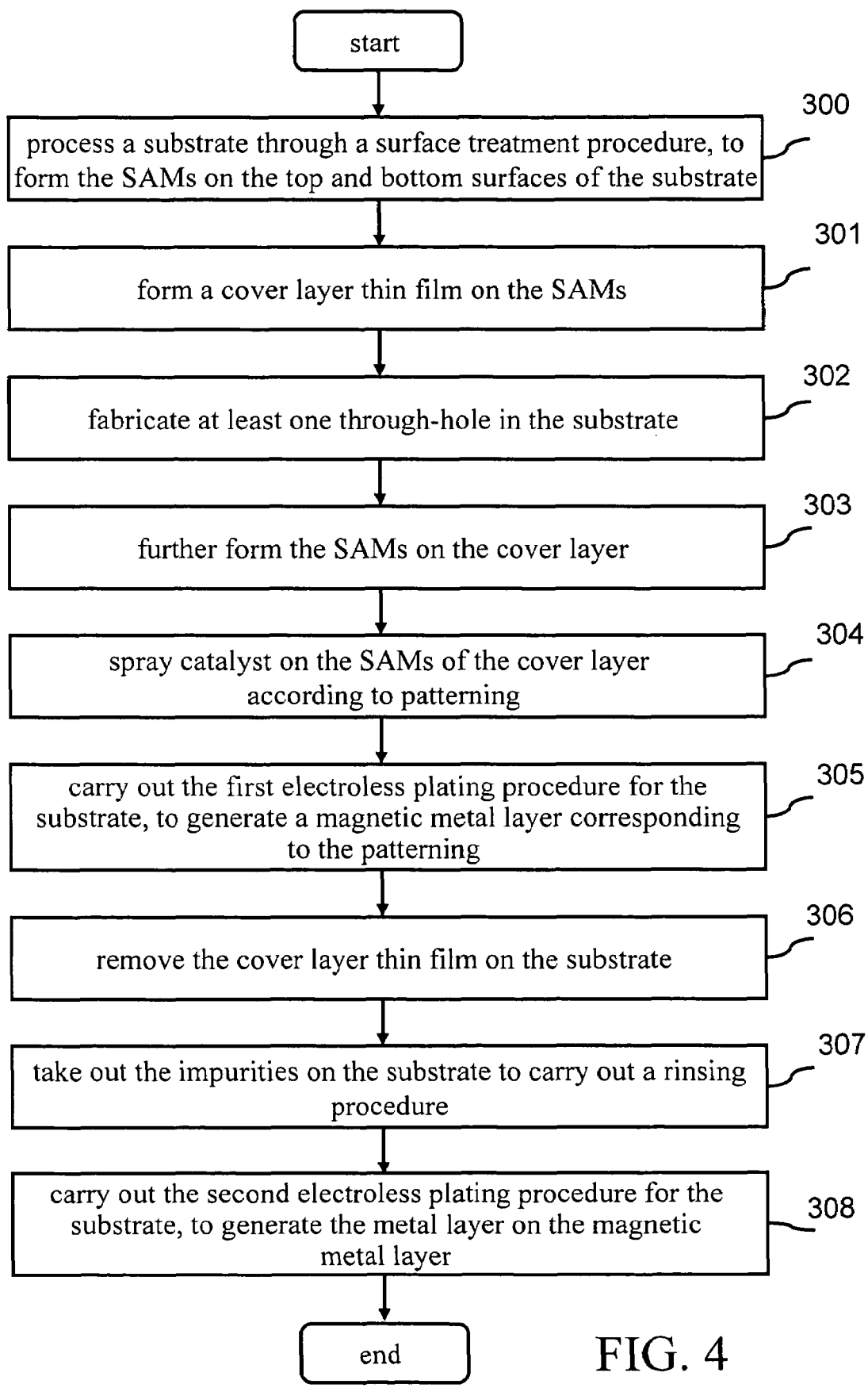
FIG. 4 is a flow chart of fabricating a double-layer RFID antenna coil according to a second embodiment of the present invention.

Referring to FIG. 4, it is a flow chart of fabricating a double-layer RFID antenna coil according to a second embodiment of the present invention, which comprises the following steps. At first, process a substrate by a surface modified procedure (e.g. plasma treatment, ion treatment, or ozone treatment), to form SAMs on the top and bottom surfaces of the substrate (Step 300), wherein the step of forming the SAMs is as shown in FIG. 2, and will not be described here.

Then, form a cover layer on the SAMs (Step 301). Fabricate at least one through hole in the substrate by mechanical drilling or laser drilling (Step 302). Further form SAMs on the cover layer (Step 303). Spray catalyst (such as $Na_2PdCl_4$ solution and Pd $(NH_3)_4Cl_2$ solution) on SAMs of the cover layer according to patterning by a PZT inkjet printer (Step 304), wherein the PZT inkjet printer sprays the catalyst.

Carry out the first electroless plating procedure for the substrate, to generate a magnetic metal (e.g. Ni, Fe or Co) layer corresponding to the patterning on the catalyst (Step 305). In the first electroless plating procedure, the substrate is immersed in an electroless plating tank filled with electroless plating bath (e.g. Ni plating solution), and then a magnetic metal layer is generated based on the redox potential principle, wherein the thickness of the magnetic metal layer may be changed by adjusting the electroless plating bath temperature and electroless plating time. Remove the cover layer on the substrate (Step 306). Then, take out the substrate to carry out a rinsing procedure (Step 307).

Carry out a second electroless plating procedure for the substrate, to generate a metal (such as Al, Ag, Cu, Ni, Fe, Co, Cd, or Pt) layer on the magnetic metal layer (Step 308). In the second electroless plating procedure, the substrate is immersed in an electroless plating tank filled with electroless plating bath (e.g. Cu plating solution), and a metal layer is generated based on the redox potential principle, wherein the thickness of the metal layer can be changed by adjusting the electroless plating bath temperature and electroless plating time.

Figure 5A:
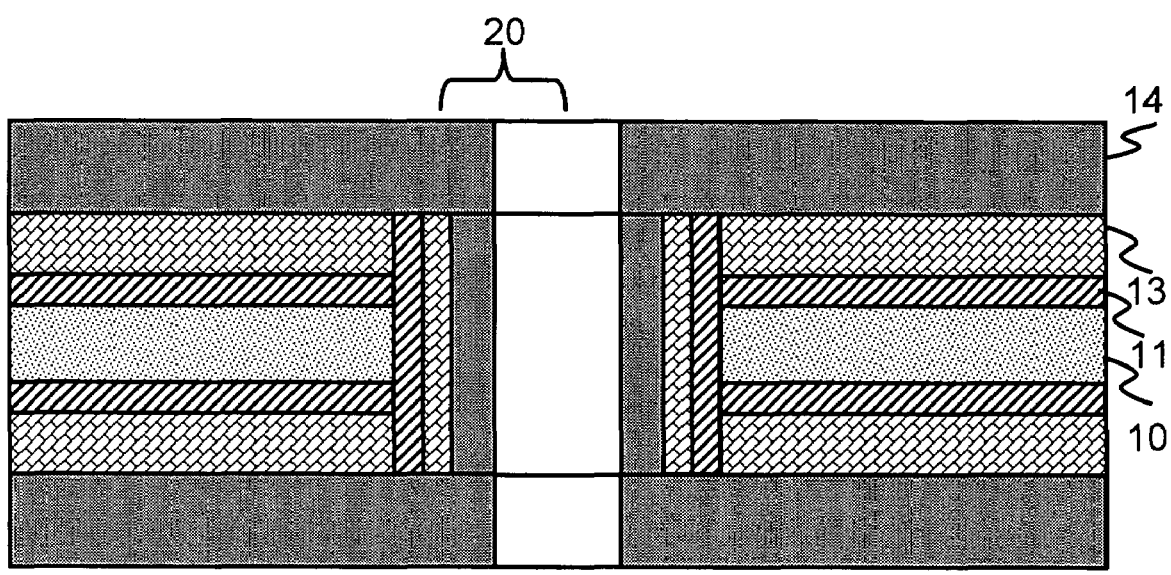
FIG. 5A is a schematic view of the double-layer RFID antenna coil according to the second embodiment of the present invention.

Referring to FIG. 5A, it is a schematic view of the double-layer RFID antenna coil according to the second embodiment of the present invention. Part of the structure is as shown in FIG. 3 and will not be described. SAMs 11, a magnetic metal layer 13, and a metal layer 14 are formed on the top and bottom surfaces of the substrate 10 respectively. And a through hole 20 is formed in the substrate 10 for connecting other embodied passive components (not shown).

Figure 5B:
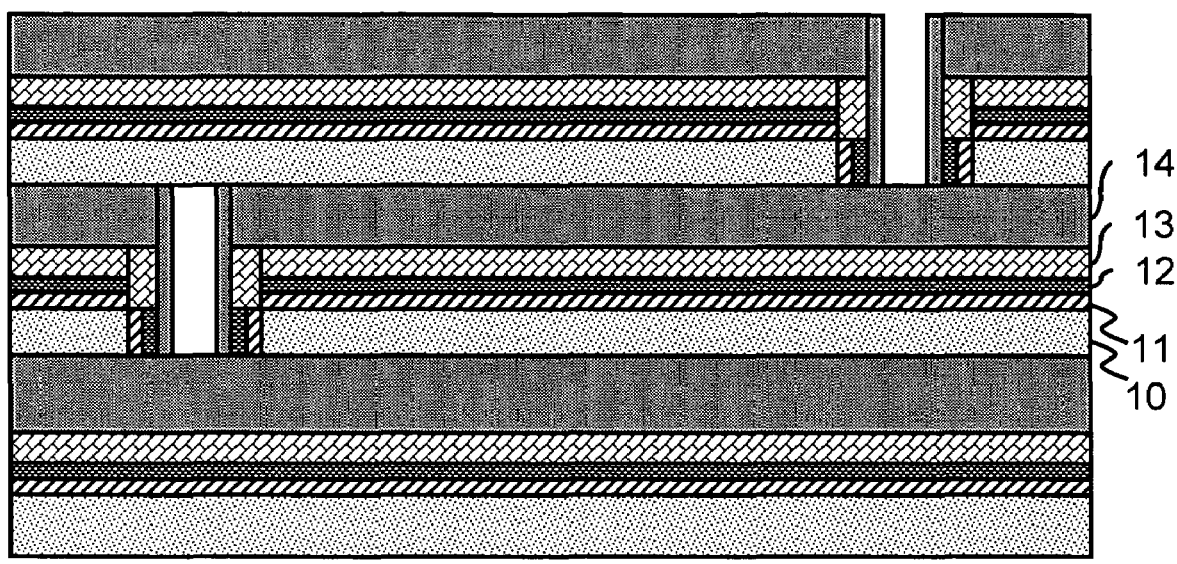
FIG. 5B is a schematic view of a multi-layer RFID antenna coil according to the second embodiment of the present invention.

Referring to FIG. 5B, it is a schematic view of a multi-layered RFID antenna coil according to the second embodiment of the present invention. Part of the structure is as shown in FIG. 5A, and will not be described here. Another substrate with metal wiring is pressed onto the top surface or the bottom surface of the substrate 10, and a through hole 20 is formed in each substrate for connecting other embodied passive components (not shown).

Figure 6A:
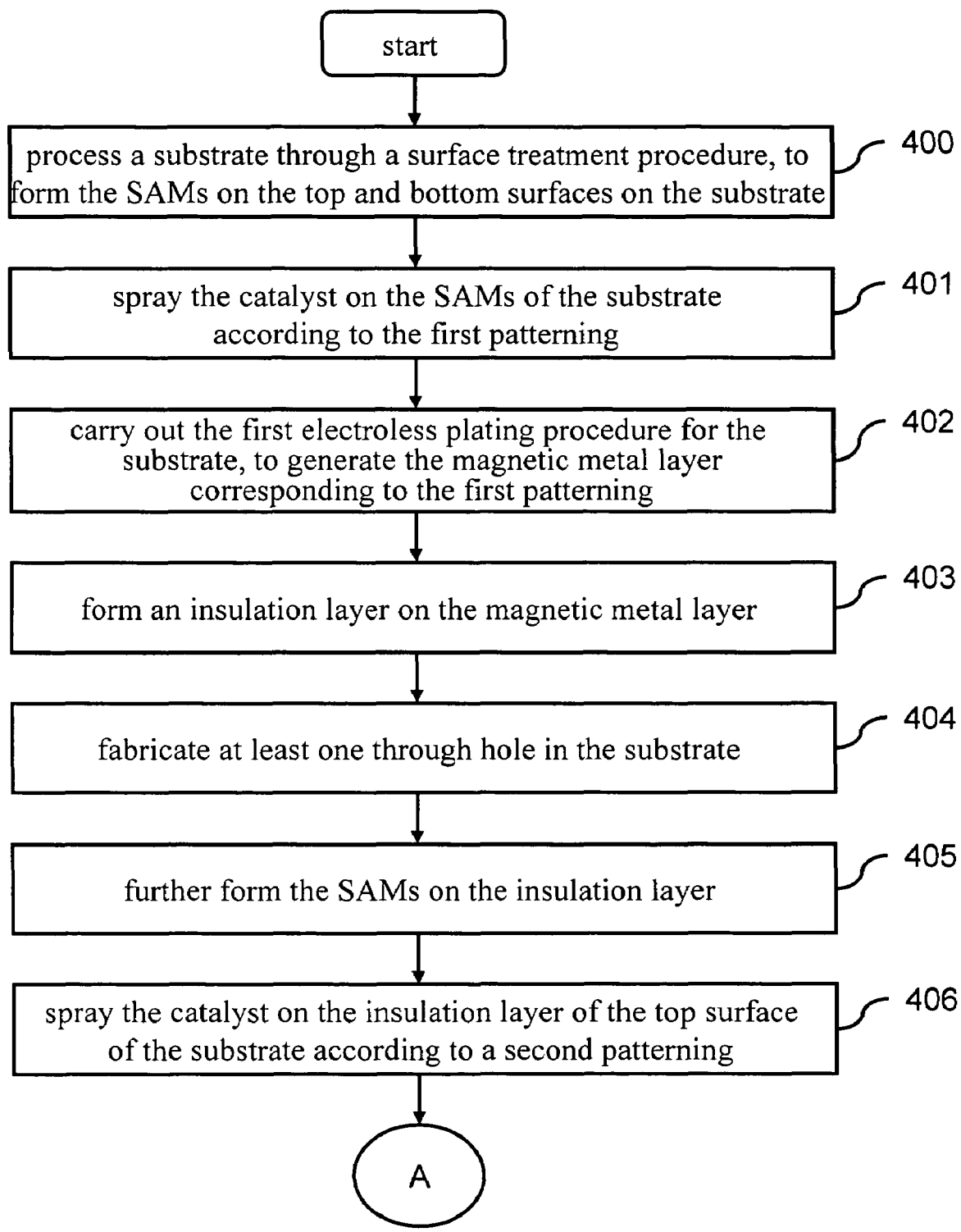
FIGS. 6A and 6B are flow charts of fabricating a thread typed RFID antenna coil according to a third embodiment of the present invention.
Figure 6B:
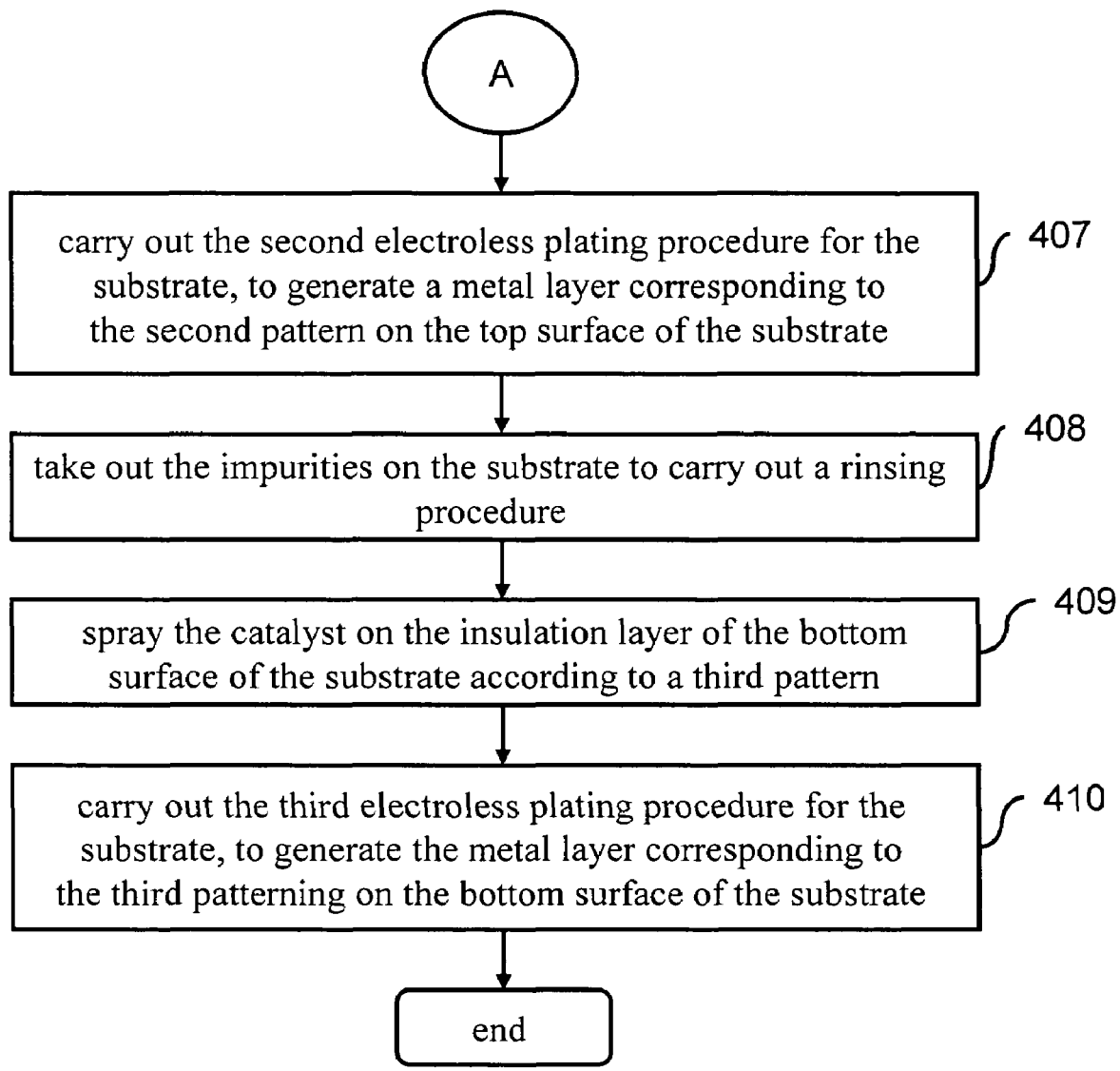

Referring to FIGS. 6A and 6B, they are flow charts of fabricating a thread typed antenna coil according to a third embodiment of the present invention, which comprise the following steps. At first, process a substrate by a surface modified procedure (e.g. plasma treatment, ion treatment, or ozone treatment), to form SAMs on the top and bottom surfaces on the substrate (Step 400), wherein the step of forming the SAMs is as shown in FIG. 2, and will not be described here.

Spray catalyst (such as $Na_2PdCl_4$ solution and Pd $(NH_3)_4$ $Cl_2$ solution) on the SAMs of the top and bottom surfaces of the substrate according to a first patterning by a PZT inkjet printer (Step 401), wherein the PZT inkjet printer sprays the catalyst on the substrate.

Carry out a first electroless plating procedure for the substrate, to generate a magnetic metal (e.g. Ni, Fe, or Co) layer corresponding to the first patterning (Step 402). In the first electroless plating processing, the substrate is immersed in an electroless plating tank filled with electroless plating bath (e.g. Ni plating solution), and a magnetic metal layer is generated based on the redox potential principle, wherein the thickness of the magnetic metal layer can be changed by adjusting the electroless plating bath temperature and electroless plating time. Form an insulation layer on the magnetic metal layer (Step 403).

Fabricate at least one through hole in the substrate through mechanical drilling or laser drilling (Step 404). Form SAMs on the insulation layer (Step 405). Spray the catalyst on the insulation layer of the top surface of the substrate according to a second patterning by a PZT inkjet printer (Step 406).

Carry out a second electroless plating procedure to the substrate, to generate a metal (such as Al, Ag, Cu, Ni, Fe, Co, Cd, or Pt) layer corresponding to the second patterning on the catalyst of the insulation layer of the top surface of the substrate (Step 407). In the second electroless plating procedure, the substrate is immersed in an electroless plating tank filled with electroless plating bath (e.g. Cu plating solution), and a metal layer is generated based on a redox potential principle, wherein the thickness of the metal layer can be changed by adjusting the electroless plating bath temperature and electroless plating time. Then, take out the substrate to carry out a rinsing procedure (Step 408).

Spray the catalyst on the insulation layer of the bottom surface of the substrate according to a third patterning by a PZT inkjet printer (Step 409). Carry out a third electroless plating procedure for the substrate, to generate a metal (such as Al, Ag, Cu, Ni, Fe, Co, Cd, or Pt) layer corresponding to the third patterning on the catalyst of the insulation layer of the bottom surface of the substrate (Step 410). In the third electroless plating procedure, the substrate is immersed in an electroless plating tank filled with an electroless plating bath (e.g. Cu plating solution), and a metal layer is generated based on the redox potential principle, wherein the thickness of the metal layer can be changed by adjusting the electroless plating bath temperature and electroless plating time. In the embodiment, the second patterning and the third patterning form a thread shape.

Figure 7:
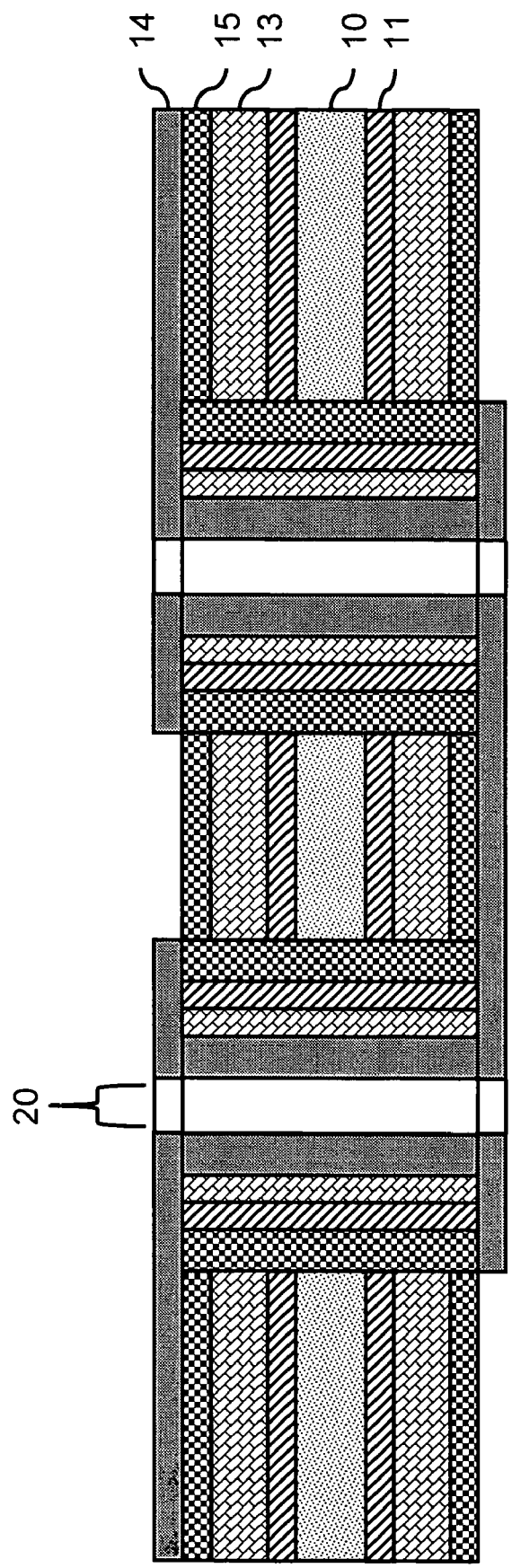
FIG. 7 is a schematic view of a thread typed RFID antenna coil according to the third embodiment of the present invention.

Referring to FIG. 7, it is a schematic view of the thread typed RFID antenna coil according to the third embodiment of the present invention. Part of the structure is as shown in FIG. 3, and will not be described here. SAMs 11, a magnetic metal layer 13, an insulation layer 15 and a metal layer 14 are formed on the top and bottom surfaces of the substrate 10 respectively, wherein the metal layer 14 is selectively formed on the top surface or the bottom surface of the substrate 10. A through hole 20 is formed in the substrate 10 for connecting other embodied passive components (not shown).

With the RFID antenna coil and fabricated method therefor, the antenna coil is made flexible by a flexible substrate, and the antenna coil thickness can be reduced and the antenna inductance can be raised through generating a magnetic metal layer and a metal layer by electroless plating.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A fabricated method of a radio frequency identification (RFID) antenna coil, comprising:
    processing a substrate through a surface modified procedure, to form a self-assembly membrane (SAMs) on a surface of the substrate;
    spraying catalyst on the SAMs of the substrate according to a patterning;
    carrying out a first electroless plating procedure for the substrate, to generate a magnetic metal layer corresponding to the patterning on the catalyst; and
    carrying out a second electroless plating procedure for the substrate, to generate a metal layer on the magnetic metal layer.

2. The fabricated method as claimed in claim 1, wherein the surface modified procedure comprises:
    immersing the substrate sequentially in an anionic polyelectrolytes solution and a cationic polyelectrolytes solution.

3. The fabricated method as claimed in claim 1, wherein the surface modified procedure adopts plasma treatment, ion treatment, or ozone treatment.

4. The fabricated method as claimed in claim 1, further comprises a step of rinsing the substrate by DI water after the step of the first electroless plating procedure.

5. The fabricated method as claimed in claim 1, wherein a material of the substrate comprises glass substrate, PET substrate, FR-4 substrate, and flexible substrate.

6. The fabricated method as claimed in claim 1, wherein the catalyst comprises Na2PdCl4 solution and Pd (NH3)4Cl2 solution.

7. The fabricated method as claimed in claim 1, wherein a material of the magnetic metal layer comprises Ni, Fe, and Co.

8. The fabricated method as claimed in claim 1, wherein the metal layer comprises Al, Ag, Cu, Ni, Fe, Co, Cd, and Pt.

9. The fabricated method as claimed in claim 1, wherein the catalyst is sprayed on the substrate further by a PZT inkjet printer.

10. The fabricated method as claimed in claim 9, wherein the PZT inkjet printer sprays the catalyst on the substrate.

* * * * *

UNITED STATES PATENT AND TRADEMARK OFFICE
CERTIFICATE OF CORRECTION

PATENT NO. : 7,661,186 B2 Page 1 of 1
APPLICATION NO. : 11/590856
DATED : February 16, 2010
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 542 days.

Signed and Sealed this

Thirtieth Day of November, 2010

David J. Kappos
*Director of the United States Patent and Trademark Office*